United States Patent
Campini et al.

(10) Patent No.: US 7,487,280 B2
(45) Date of Patent: Feb. 3, 2009

(54) ENABLING PORTS ON A MODULE RECEIVED IN A SLOT IN A CHASSIS

(75) Inventors: Edoardo Campini, Mesa, AZ (US);
Douglas P. Bogia, Hillsboro, OR (US);
Robert J. Albers, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 250 days.

(21) Appl. No.: 11/432,912

(22) Filed: May 12, 2006

(65) Prior Publication Data
US 2007/0266192 A1    Nov. 15, 2007

(51) Int. Cl.
*G06F 13/00* (2006.01)
(52) U.S. Cl. .......................... 710/301; 385/14; 385/88; 385/89; 385/92
(58) Field of Classification Search ................ 710/301, 710/302, 316; 385/14–16, 53, 88, 89, 92
See application file for complete search history.

(56) References Cited

U.S. PATENT DOCUMENTS

| 7,083,422 | B2 | 8/2006 | Campini et al. |
| 7,272,274 | B1 * | 9/2007 | Albers et al. ................. 385/14 |
| 2006/0223343 | A1 * | 10/2006 | Campini et al. ............... 439/64 |
| 2007/0061433 | A1 * | 3/2007 | Reynolds et al. ............ 709/223 |

OTHER PUBLICATIONS

United States Patent Application, pending—not yet published, U.S. Appl. No. 11/393,389, to Fallah-Adl, filed Mar. 30, 2006.
United States Patent Application, pending—not yet published, U.S. Appl. No. 11/393,067 to Albers, filed Mar. 30, 2006.
United States Patent Application, pending—not yet published, U.S. Appl. No. 11/395,906, to Fallah-Adl, filed Mar. 31, 2006.
PCI Industrial Computer Manufacturers Group (PICMG), Advanced Telecommunications Computing Architecture (ATCA) Base Specification, PIGMG 3.0 Revision 1.0, published Dec. 30, 2002.

* cited by examiner

*Primary Examiner*—Glenn A Auve
(74) *Attorney, Agent, or Firm*—Blakely, Sokoloff, Taylor & Zafman LLP

(57) ABSTRACT

Information is obtained from a module received in a slot in a chassis. The information includes a number of ports in one or more module connectors which route at least one communication channel associated with a communication interfaces on the module. A determination is made as to the number of ports the slot has a capability to route the at least one communication channel to one or more backplanes in the chassis and to another module received in another slot in the chassis. A given number of ports in the one or more module connectors are enabled to forward data from the communication interface on the module and through the at least one communication channel to the other module based on the determination.

23 Claims, 6 Drawing Sheets

ENABLING PORTS ON A MODULE RECEIVED IN A SLOT IN A CHASSIS

RELATED APPLICATIONS

This application is related to U.S. application Ser. No. 10/824,323, filed by Edoardo Campini, David Formisano, Marwan Khoury, Ho Wang, Andy Saffarian, Jerome Saint-Cyr and Douglas Stahl on Apr. 14, 2004 and entitled "Switching System;" U.S. application Ser. No. 11/393,389, filed by Hassan Fallah-Adl, Edoardo Campini, and Robert Albers on Mar. 30, 2006 and entitled "Module to Couple to a Plurality of Backplanes in a Chassis;" U.S. application Ser. No. 11/393,067, filed by Robert Albers, Edoardo Campini and Hassan Fallah-Adl on Mar. 30, 2006 and entitled "Module to Couple to an Electrical and an Optical Backplane;" U.S. application Ser. No. 11/395,906, filed by inventors David Formisano, Hassan Fallah-Adl and Edoardo Campini on Mar. 31, 2006 and entitled "Sparse Mesh Fabric Interface."

BACKGROUND

Modular platform systems are typically used in communication networks where reliability is increased and cost reduced by the use of interoperable pieces. Such interoperable pieces may include shelves or chassis. Typically, each chassis receives and couples in communication various other interoperable pieces such as modules. These modules may include circuit boards or mezzanine cards. These boards or mezzanine cards may include, but are not limited to, blades, carrier boards, processing boards, switches, hubs, etc. Other interoperable pieces that are received and coupled in a chassis may include components such as fans, power equipment modules (PEM), field replaceable units (FRUs), alarm boards, etc.

Some industry initiatives are seeking ways to standardize the way pieces or elements in a modular platform system interoperate. One such initiative is the PCI Industrial Computer Manufacturers Group (PICMG), Advanced Telecommunications Computing Architecture (ATCA) Base Specification, PICMG 3.0 Rev. 1.0, published Dec. 30, 2002, and/or later versions of the specification ("the ATCA specification"). Typically modules designed to operate according to the ATCA specification are received in slots in a chassis. These modules may then couple to a backplane that is also designed to operate according to the ATCA specification via a connector on the modules. Typically, a communication channel associated with a communication interface on an ATCA compliant module received in a slot is routed through one or more ports, pins, lanes or interconnects in a module connector. This communication channel may then be routed over the ATCA compliant backplane to another ATCA compliant module received in another slot.

DETAILED DESCRIPTION

Figure 1:
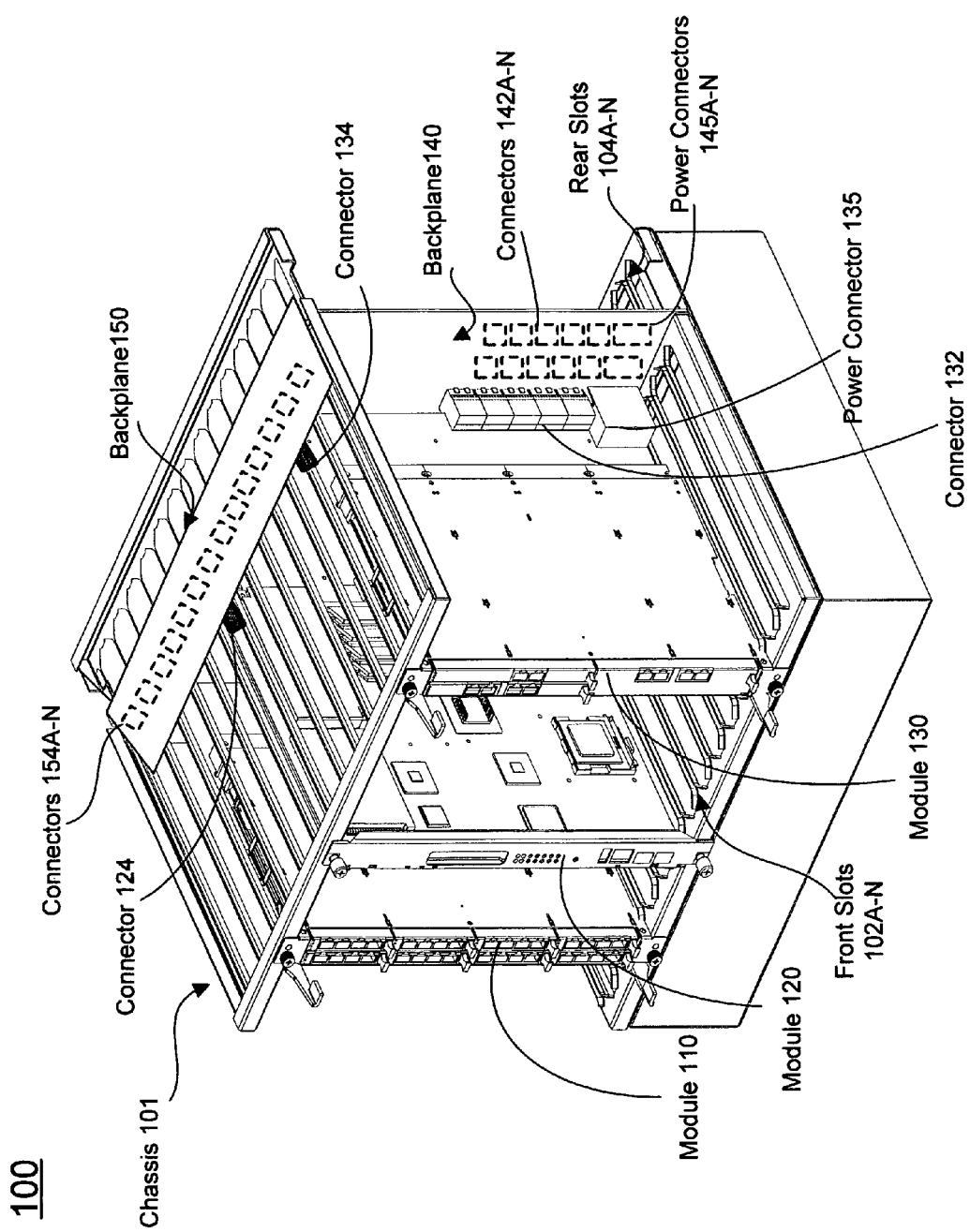
FIG. 1 provides a partial view of an example modular platform system with modules coupled to backplanes in a chassis.

As mentioned in the background, a module that is received in a slot in an ATCA compliant chassis may couple to a backplane via a connector on the module. A communication channel associated with a communication interface on the module is routed through ports in the connector to the backplane. The communication channel is then possibly routed to another module received in another slot in the chassis. As a result, in one example, these modules may couple in communication via the communication channel routed to the backplane. These communication channels may be used to forward data from a communication interface on each module and then through portions of the communication channel that are routed over the backplane and/or through other elements in the ATCA chassis (e.g., switches or hubs).

Typically, a backplane in a standard ATCA chassis is limited in the number of communication channels allocated to route communication channels associated with a communication interface (e.g., a fabric interface) on a module. For example, a type of ATCA compliant chassis is designed to receive and couple in communication 14 modules. For this ATCA design, 12 modules or boards may be coupled in communication through two switch or hub modules. This configuration is referred to in the ATCA specification as a dual-star fabric topology. In a dual-star fabric topology, according to the ATCA specification, no more than one communication channel associated with a communication interface on a module is provided to a given non hub/switch module to forward data to another module when coupled to a backplane in the ATCA chassis. Also, a limited number of ports are included in an ATCA module's connector to route the single communication channel to the backplane. A single communication channel and a limited number of ports in a connector to route the single communication channel may result in a bottleneck for data forwarded from this non hub/switch module. This bottleneck is problematic to the throughput of data forwarded through that communication interface on the module and also limits the throughput capability of a modular platform system.

One way to address the single communication channel bottleneck is to enhance the capabilities of modules and backplanes to route additional communication channels associated with fabric interfaces on these modules or provide additional ports for a given communication channel. For example, additional communication channels may be added to a single backplane with slots in a chassis that have a capability to route the communication channels from additional ports in module connectors. Additional communication channels may also be added via multiple backplanes in a chassis to couple to modules received in chassis slots, the modules including enhanced capabilities to utilize the possibility of routing additional channels via the multiple backplanes. However, standardized hardware managers for ATCA compliant chassis or shelves (e.g., shelf managers) may not recognize these enhanced capabilities and may require modifications to utilize the enhanced capabilities. Thus modules and backplanes with enhanced capabilities (e.g., superset to the ATCA specification) may be problematic to low cost implementations of standardized modular platform systems. This possibly adds costs and may diminish the value of the enhanced modules and backplanes in a standardized modular platform system.

In one example, information is obtained from a module received in a slot in a chassis. The information includes a number of ports in one or more module connectors which route at least one communication channel associated with a communication interfaces on the module. A determination is made as to the number of ports the slot has a capability to route the at least one communication channel to one or more backplanes in the chassis and to another module received in another slot in the chassis. A given number of ports in the one or more module connectors are enabled to forward data from the communication interface on the module and through the at least one communication channel to the other module based on the determination.

FIG. 1 provides a partial view of an example modular platform system 100 with modules coupled to backplanes in a chassis 101. As depicted in FIG. 1, modules (e.g., front boards) 110, 120 and 130 are received in front slots 102C, 102F and 102L of front slots 102A-N. Chassis 101 is also shown as including rear slots 104A-N to receive modules, e.g., rear transition modules (RTMs).

In one implementation, chassis 101 includes a plurality of backplanes to couple to modules that are received in its front or rear slots. For example, the plurality of backplanes includes backplanes 140 and 150. These backplanes, for example, may couple to at least a subset of modules inserted or received in front slots 102A-N, (e.g., modules 110, 120 or 130).

Backplane 140, as depicted in FIG. 1, includes connectors 142A-N and power connectors 145A-N. In one implementation, connectors 142A-N couple to communication interfaces on modules received in front slots 102A-N. For example, connector 142L couples to connector 132 on module 130. Power connectors 145A-N, in one example, provide power to modules received in front slots 102A-N. For example, power connector 145L couples to power connector 135 on module 130 to provide power to module 130.

Backplane 150, as depicted in FIG. 1, includes connectors 154A-N. In one implementation, connectors 154A-N may couple to modules received in front slots 102A-N. For example, connectors 154F and 154L couple to connectors 124 and 134, respectively, on modules 120 and 130. As shown in FIG. 1, module 110 lacks a communication interface to couple to backplane 150. As described in more detail below, backplane 150 is an additional backplane used to route more communication channels and/or provide an ability for a module to route a given communication channel via additional ports. This additional backplane, for example, gives chassis 101 enhanced capabilities. Further, module 110's lack of a connector to couple to backplane 150 and module 120 and 130's inclusion of a connector to couple to backplane 150 make modules 120 and 130 examples of modules with enhanced capabilities. These enhanced capabilities may include routing more communication channels and/or having additional ports to route one or more communication channels to a backplane.

In one example, chassis 101 is designed to operate in compliance with the ATCA specification. Additionally, backplane 140 and modules received in front slots 102A-N may also be designed to operate in compliance with at least the ATCA specification, although this disclosure is not limited to only ATCA complaint chassis, backplanes and modules but may also apply to Compact Peripheral Component Interface (COMPACT PCI), VersaModular Eurocard (VME), or other types of industry standards governing a standardized design and operation of chassis, backplanes and modules. In addition, this disclosure may also apply to proprietary chassis, backplanes and modules designed to operate in a modular platform system.

In one implementation, connector 132 on module 130 is to couple to backplane 140 in an ATCA backplane region called "zone 2". The ATCA specification refers to zone 2 as the data transport connector zone. In this implementation, connector 132 includes ports that can route a communication channel associated with a base interface (not shown) or a fabric interface (not shown) on module 130 to backplane 140. The fabric interface, for example, is used to forward data through a communication channel, a portion of which is routed over backplane 140. At least some of the data, for example, is forwarded to other modules received in front slots 102A-N and/or rear slots 104A-N.

In one example, front slots 102A-N and backplane 140 in an ATCA compliant chassis 101 are configured in a dual-star fabric topology. As mentioned above, a single communication channel is provided in a dual-star fabric topology to a non hub/switch module received in a slot for an ATCA compliant chassis in order to forward data from a communication interface on the non hub/switch module to a given hub/switch also received in a chassis slot. So in one implementation, module 130 is a non hub/switch module and connector 132 on module 130 couples to connector 142L when module 130 is received in front slot 102L. At least a portion of data destined for another node is forwarded via a communication channel associated with a communication interface on module 130. The communication channel is routed to one or more ports in connector 132, to connector 142L on backplane 140 and then to the other module received in another slot in chassis 101 or to modules remotely located to chassis 101.

In one example, connectors 154A-N on backplane 150 may couple to connectors on modules received in front slots 102A-N. This may provide additional communication channels and/or ports/lanes for these modules to forward data from their communication interfaces to other modules received in slots in chassis 101. So in the above non hub/switch implementation, module 130 couples to connector 154L via connector 134 when module 130 is received in front slot 102L. At least another portion of data destined for the other module is forwarded through another communication channel associated with a communication interface on module 130 and/or through additional ports in connector 132.

In one implementation, a communication interface (e.g., a fabric interface) for a module received in chassis 101 may be designed to support one or more packet-based communication protocols. Several packet-based communication protocols, for example, are associated with and/or described by sub-set specifications to the ATCA specification and are typically referred to as the "PICMG 3.x specifications". The PICMG 3.x specifications include, but are not limited to, Ethernet/Fibre Channel (PICMG 3.1), INFINIBAND (PICMG 3.2), STARFABRIC (PICMG 3.3), PCI-Express/Advanced Switching (PICMG 3.4), Advanced Fabric Interconnect/ S-RapidIO (PICMG 3.5) and Packet Routing Switch (PICMG 3.6).

In one example, a communication interface associated with a communication channel routed to connector 132 or to connector 134 supports or operates in accordance with a communication protocol described in a PICMG 3.x specification. This PICMG 3.x specification support, for example, is to facilitate the forwarding of large amounts of data from module 130 and through at least one communication channel routed over backplane 140 and/or 150 in a rapid manner (high throughput).

In other implementations, a communication interface for a module received in chassis 101 may be designed to support other types of communication protocols. For example, the fabric interface may support time division multiplexing (TDM) and/or frequency division multiplexing (FDM). A communication interface that supports TDM, for example, may operate in compliance with one or more industry standards. One such industry standard is the Optical Internetworking Forum (OIF), TFI-5: TDM Fabric to Framer Interface Implementation, published September, 2003 and/or later versions ("the TFI-5 specification").

In one example, a communication channel associated with a communication interface on a module that is routed to a port in a module connector that couples to backplane 140 operates in compliance with one or more packet-based PICMG 3.x specifications. In this example, a communication channel associated with a communication interface on the module that is routed to a port in a connector that couples to backplane 150 operates in compliance with a TDM-based standard such as the TFI-5 specification. Thus, in this example, packet-based communication protocols are used to forward data from modules via communication channels routed to backplane 140 and TDM-based communication protocols are used to forward data from modules via communication channels routed to backplane 150.

Figure 2:
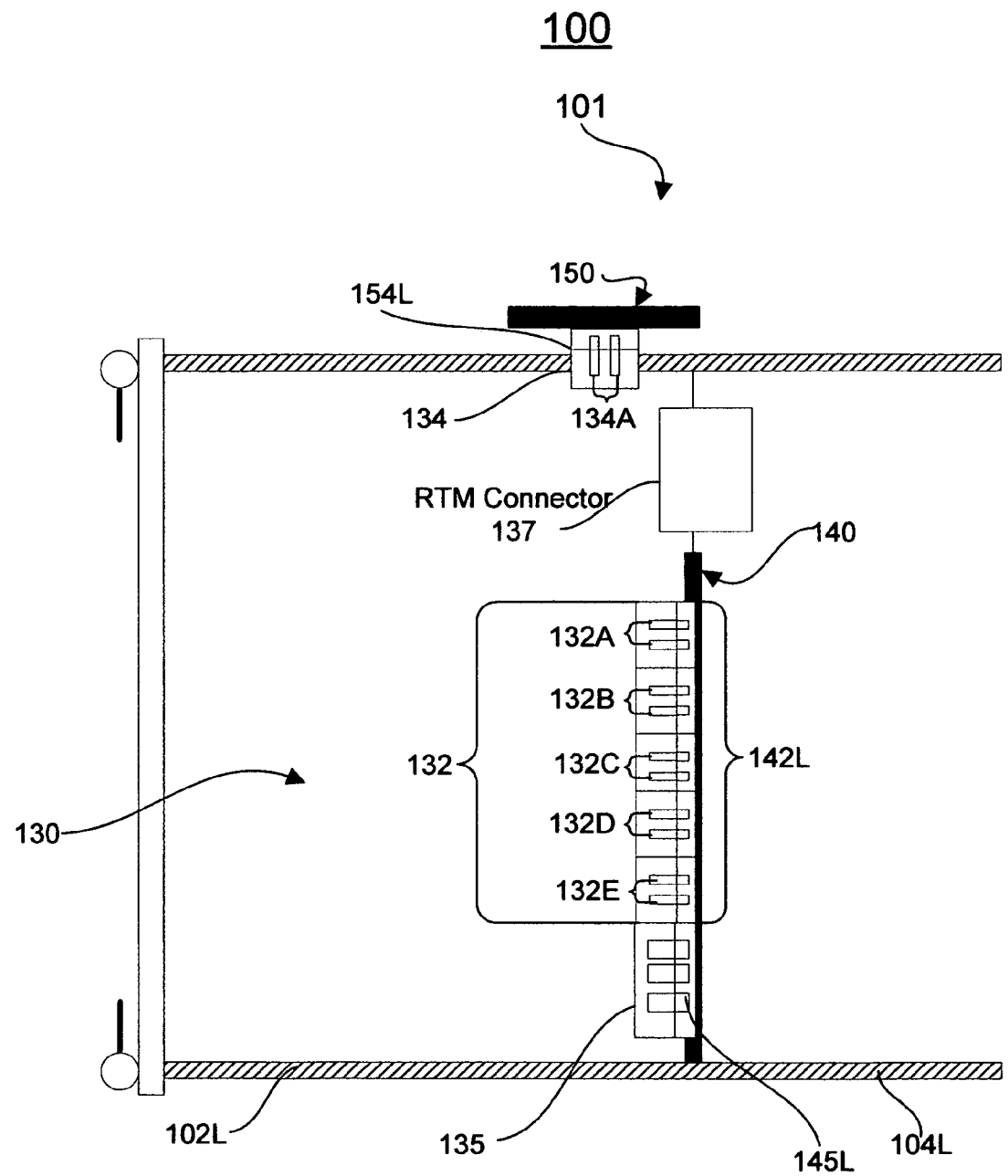
FIG. 2 provides a side view of a portion of the example modular platform system with a module received in a slot.

FIG. 2 provides a side view of a portion of modular platform system 100 with module 130 received in front slot 102L in chassis 101. As portrayed in FIG. 2, in one example, chassis 101 includes backplane 140 and backplane 150. In one example, backplane 150 is located or mounted just above front slots 102A-N and thus above module 130 when received in front slot 102L. In other implementations, backplane 150 may also be placed or mounted below front slots 102A-N or in various other locations within chassis 101.

As described above for FIG. 1, module 130 includes connectors 132 and 134 that couple to connectors on these two backplanes when received in front slot 102L. In one implementation, various ports which may also be referred to as interconnects, lanes or pins are included in a connector on module 130 and are configured to route a communication channel associated with a communication interface to backplanes 140 and 150. These ports are portrayed in FIG. 2 as ports 132A-E and 134A. At least one port of ports 132A-E, for example, routes a communication channel associated with a communication interface on module 130 to backplane 140.

In one example, one or more ports of ports 132A-E and 134A are configured to route a communication interface to backplane 140 and/or 150 in an impedance controlled manner (e.g., via copper-based traces). In another example, the one or more ports are configured to route the communication channel via other manners such as in an optical (e.g., via optical paths), inductive or capacitive manner. These port configurations, for example, may incorporate the use of micro electromechanical systems (MEMS) which may be fabricated using silicon manufacturing technologies. The port configurations may also be based on the type of communication channel to be routed to backplanes 140 or 150. Types of communication channels, for example, may include electrical-based communication channels routed to backplane 140 and optical-based communication channels routed to backplane 150. Types of communication channels may also include the communication protocol used to forward data over the communication channel, e.g., PICMG 3.x, TFI-5, etc.

In one example, ports 132A-E included in connector 132 for an ATCA compliant module 130 are high density, impedance controlled connectors as described in the ATCA specification. In this example, based on module 130's insertion in front slot 102L, interconnects 132A-E route at least one communication channel to backplane 140 through connector 142L. As a result, a communication channel associated with a communication interface on module 130 is coupled to a communication channel possibly routed to backplane 140 from front slot 102L.

In one implementation, port 134A included in connector 134 is a port configured to route a communication channel to backplane 150 in an optical, an inductive or a capacitive manner. In this example, based on module 130's insertion in front slot 102L, port 134A routes at least one communication channel to backplane 150 through connector 154L. As a result, a communication channel associated with a communication interface on module 130 is coupled to a communication channel possibly routed to backplane 150 from front slot 102L.

In one example, RTM connector 137 is a connector to couple to an RTM (e.g., received in rear slot 104L). In one implementation, RTM connector 137 is located in an area for an ATCA compliant chassis that is described in the ATCA specification as "zone 3." Although not shown in FIG. 2, in one example, backplane 140 may include connectors that extend into zone 3 for front slot 102L. RTM connector 137 on module 130 may be replaced with a connector to couple to these zone 3 connectors. The connector may provide one or more additional ports to route at least a portion of a communication channel to the connectors on backplane 140 that extend into zone 3. Thus in this example, the zone 3 extension provides front slot 102L with the capability to route at least a portion of a communication channel through the one or more additional ports to backplane 140.

Figure 3:
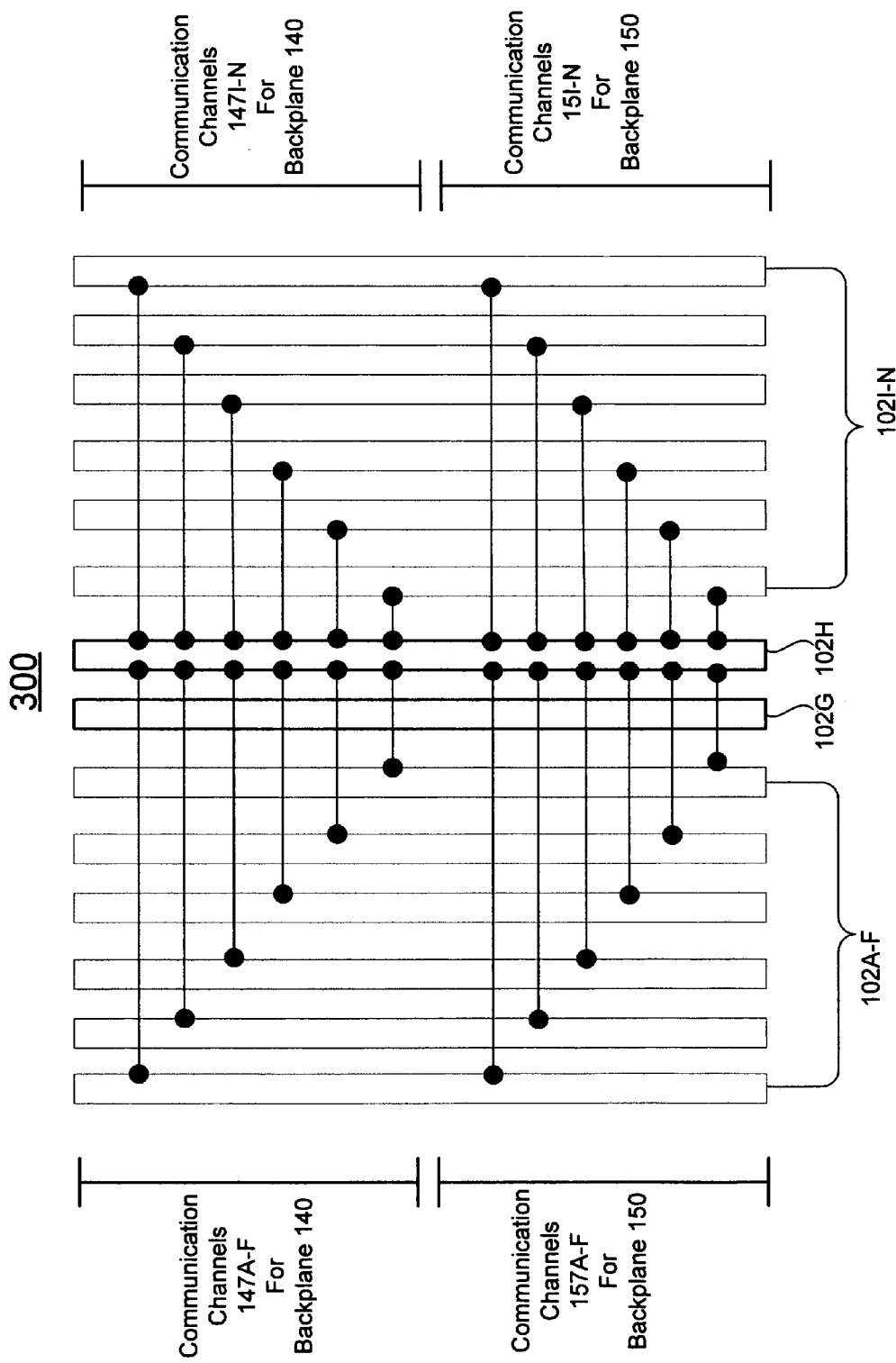
FIG. 3 provides a diagram of an example fabric architecture.

FIG. 3 provides a diagram of an example fabric architecture 300. In one example, fabric architecture 300 portrays the communication channels associated with communication interfaces on modules that are to be routed from front slots 102A-F/I-N in chassis 101 and over backplane 140 and backplane 150 to front slot 102H. In this example, the topology of fabric architecture 300 is part of a dual-star fabric topology that has modules with the capability to function as switches for data exchanged between other modules. The data forwarded, for example, from a communication interface on each module. The fronts slots with the capability to route communication channels to/from these switch modules, for example, are depicted in FIG. 3 as front slots 102G and 102H.

Only the communication channels routed to front slot 102H are depicted in FIG. 3 to portray part of the dual-star fabric topology. The other part (not shown) would be communication channels routed from front slots 102A-F/I-N to front slot 102G. One or more communication channels may also be routed between front slots 102G and 102H for redundancy and/or fault tolerance purposes and these channels are also not depicted in FIG. 3.

In one example of the topology of fabric architecture 300, front slots 102A-F/I-N each have the capability to route a communication channel to backplane 140 and a communication channel to backplane 150 and then to a switch module received in front slot 102H. In one example, communication channels 147A-F/I-N are routed to backplane 140 and communication channels 157A-F/I-N are routed to backplane 150. This disclosure is not limited to only fabric architectures in dual-star topology but also may include fabric architectures in other types of topologies such as dual-dual star, full-mesh, partial mesh, sparse mesh, etc.

In one implementation, communication channels 147A-F/I-N are a type of communication channel that is electrical-based and includes copper-based traces. These copper-based traces, for example, route communication channels associated with one or more communication interfaces on modules received in front slots 102A-F/I-N to backplane 140, and to hub or switch modules received in front slot 102G and/or 102H. Thus, in this implementation, communication channel 147A may be associated with a communication interface on module 130 and would be routed through connector 132 to backplane 140 when module 130 is received in front slot 102L. Backplane 140 may then route communication channel 147A to a switch module received in front slot 102H as portrayed in FIG. 3.

In one implementation, communication channels 157A-F/I-N are a type of communication channel that is optical-based and includes optical paths. These optical paths include, for example, plastic or glass fibers and/or plastic or glass waveguides to route communication channels associated with communication interfaces on modules received in front slots 102A-F/I-N to backplane 150, and to switch modules received in front slot 102G and/or 102H. Thus, in this implementation, communication channel 157A may be associated with a communication interface on module 130 and would be routed through connector 134 to backplane 150 when module 130 is received in front slot 102L. Backplane 150 may then route communication channel 157A to a switch module received in front slot 102H as portrayed in FIG. 3.

Figure 4:
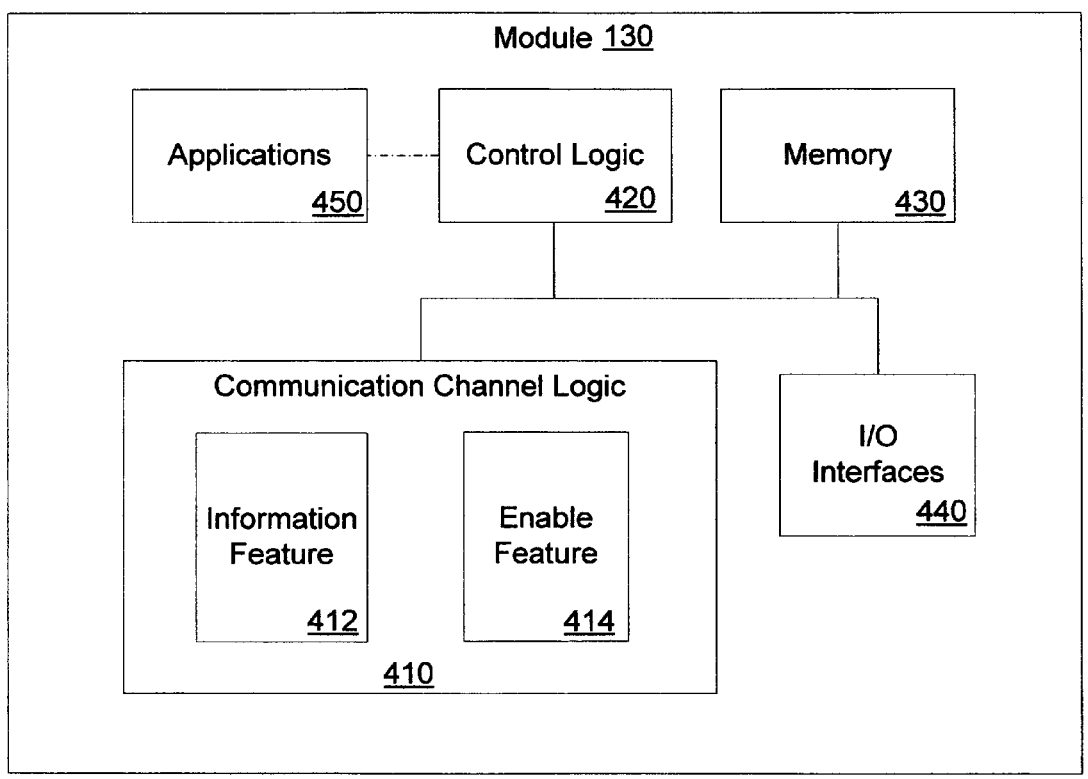
FIG. 4 provides a block diagram of an example module architecture.

FIG. 4 is a block diagram of an example module architecture. In FIG. 4, module 130's architecture is shown as including communication channel logic 410, control logic 420, memory 430, input/output (I/O) interfaces 440 and optionally one or more applications 450, each coupled as depicted.

In one example, the elements portrayed in FIG. 4's block diagram are those elements to support or enable communication channels associated with a communication interface on module 130 when received in a slot in a chassis as described in this disclosure. For example, communication channel logic 410 and control logic 420 each or collectively represent any of a wide variety of logic device(s) or executable content to implement the features depicted as part of communication channel logic 410. These logic device(s) may include a microprocessor, network processor, service processor, microcontroller, field programmable gate array (FPGA), application specific integrated circuit (ASIC), sequestered thread or core of a multi-core/multi-threaded microprocessor, special operating mode of a processor (e.g., communication channel management mode) or combination thereof.

In FIG. 4, communication channel logic 410 includes information feature 412 and enable feature 414. In one implementation, communication channel logic 410 uses these features to perform several functions. These functions include, for example, obtaining information, using that information to determine whether a slot in a chassis has the capability to route a communication channel to a backplane and enabling a communication channel based on that determination to forward data to another module.

Control logic 420 may control the overall operation of module 130 and as mentioned above, may represent any of a wide variety of logic device(s) or executable content to implement the control of module 130. In alternate examples, the features and functionality of control logic 420 are implemented within communication channel logic 410.

According to one example, at least a portion of memory 430 is memory that is used to temporarily store information. For example, information related to determining whether a slot in a chassis has the capability to route at least one communication channel between modules received in slots in a chassis. Memory 430 may also temporarily store information that module 130 provides to other modules or to a hardware manager (e.g., a shelf manager) for a chassis (see FIG. 5). This information may be used to determine operational characteristics of module 130 to include the type of communication channel(s) routed to ports included in one or more connectors on the module when received in a slot. Memory 430 may also store executable content. The executable content may be used by control logic 420 and/or communication channel logic 410 to implement or activate other features or elements of module 130.

Input/output (I/O) interfaces 440 may provide an interface via a communication medium or channel between module 130 and elements within or remote to a chassis. As a result, I/O interfaces 440 may enable communication channel logic 410 or control logic 420 to receive a series of instructions from these elements. The series of instructions may enable communication channel logic 410 and/or control logic 420 to implement one or more features depicted in FIG. 4 as part of communication channel logic 410.

In one implementation, I/O interfaces 440 include one or more communication interfaces. In one example, as mentioned above, a communication channel may be associated with a fabric interface on module 130 and data may be forwarded from these one or more communication interfaces. In one example, these communication interfaces may support or operate in compliances with one or more communications protocols. These communication protocols may include, but are not limited to those protocols described in the PICMG 3.x specification or other specifications such as the TFI-5 specification.

In one example, I/O interfaces 440 also include other communication interfaces (e.g., a base interface) to communicate with other interoperable pieces in a chassis. In one example, these communication interfaces may operate in compliance with the ATCA specification and may use 10/100/1000 BASE-T Ethernet communication protocols ("Ethernet") to forward data and/or instructions between module 130 and these other interoperable pieces in the chassis.

In one example, module 130 couples to a management bus in chassis 101 that is described in the ATCA specification as an Intelligent Platform Management Bus (IPMB). According to the ATCA specification, an IPMB may be capable of providing management and/or control communications between modules and/or other interoperable pieces within a chassis. An ATCA IPMB complies and/or is compatible with the "Intelligent Platform Management Bus Communications Protocol Specification," Document Revision 1.0, published Nov. 15, 1999, and/or later versions of the standard (the "IPMB standard"). Additionally, an example communication protocol that may be used when communicating via an IPMB is described in the Intelligent Platform Management Interface (IPMI) Standard detailed in the "Intelligent Platform Management Interface Specification, v1.5, Document Revision 1.1, dated Feb. 20, 2002, published by Intel, Hewlett-Packard, NEC, and Dell, and/or later versions of the standard (the "IPMI standard"). An I/O interface of I/O interfaces 440, in one example, operates in compliance with this IPMI standard to communicate via an IPMB.

In one implementation, module 130 includes logic to send/receive management or control information on an IPMB when received in a slot in chassis 101. This logic, for example, may include logic to implement the functions of an Intelligent Platform Management Controller (IPMC) as described in the ATCA specification. This logic, for example, is implemented by control logic 420 and/or communication channel logic 410.

In one example, module 130 includes one or more applications 450 to provide internal instructions to control logic 420 and/or communication channel logic 410.

Figure 5:
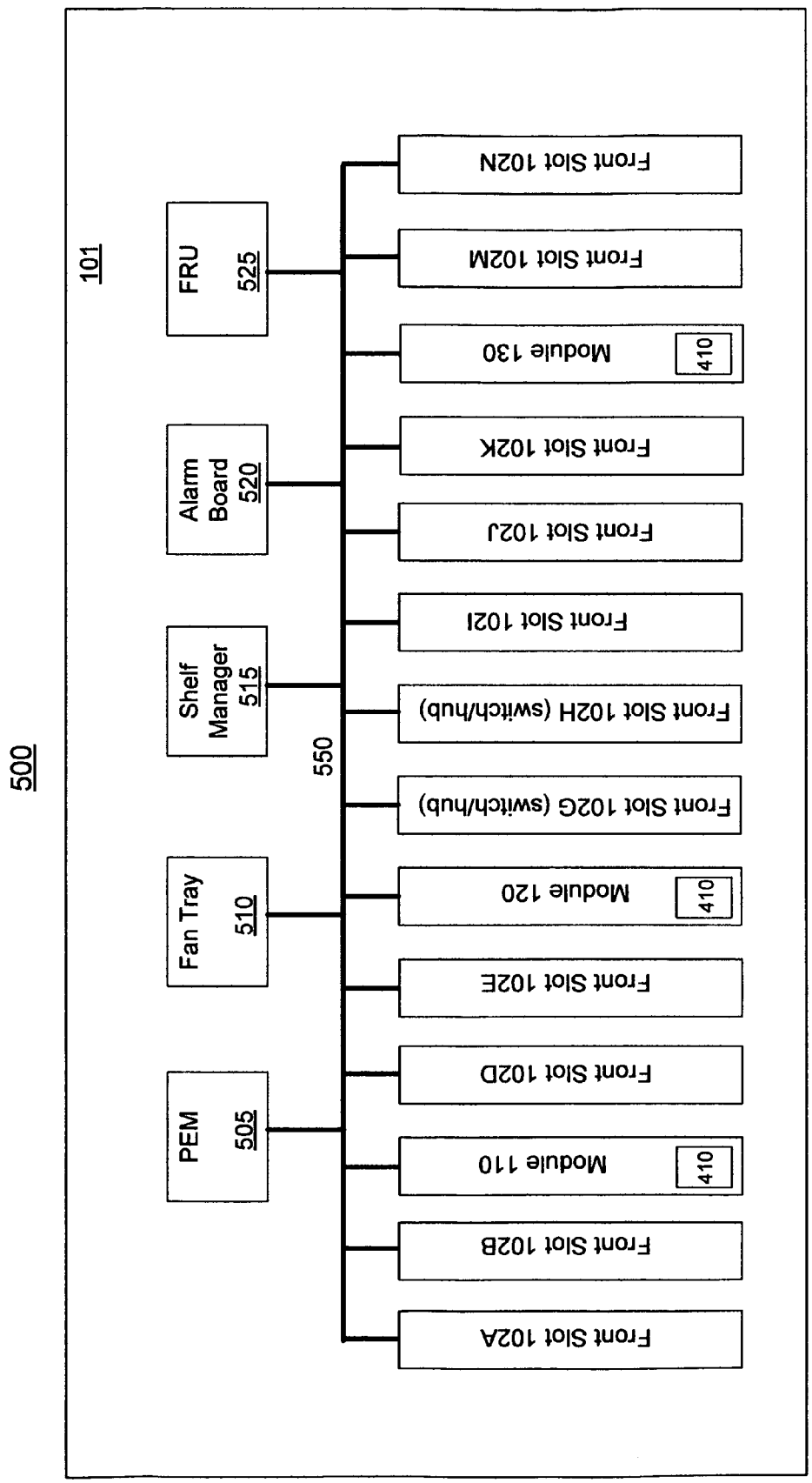
FIG. 5 provides a block diagram of an example architecture for the modular platform system.

FIG. 5 provides a block diagram of an example architecture 500 for modular platform system 100 that includes interoperable pieces in chassis 101. As depicted in FIG. 5, these interoperable pieces in chassis 501 include PEM 505, fan tray 510, shelf manager 515, alarm board 520, FRU 525 and modules received in front slots 102A-N (modules 110, 120 and 130) coupled together by communication link or channel 550. Two front slots, for example, front slots 102G and 102H, are shown in FIG. 5 as reserved for hub or switch modules to support a dual-star topology as described for FIG. 3.

In one implementation, an ATCA compliant modular platform system 100 includes chassis 101. Chassis 101, for example, can also be referred to as a "shelf." Thus, in this implementation, shelf manager 515 is a hardware manager to manage the interoperability of the shelf or chassis pieces shown in FIG. 5.

In one example, as depicted in FIG. 5, chassis 101 includes a PEM 505 capable of providing power to chassis 101, a fan tray 510 to provide cooling of chassis 101, an alarm board 520 to provide visual notifications of fault conditions in chassis 101, and a FRU 525. FRU 525, for example may be a piece or component to provide additional functionality to chassis 101 (e.g., additional input/output connections, memory storage or power). As depicted in FIG. 5, these pieces may be coupled via communication link 550 and shelf manager 515 may use communication link 550 to manage logical bus or software configurations and facilitate communications between these pieces and other pieces in chassis 101.

As depicted in FIG. 1 and logically depicted in FIG. 5, modules 110, 120 and 130 are received in front slots 102C, 102F and 102L, respectively. As described in the ATCA specification, modules received in slots in an ATCA compliant chassis couple in communication via a backplane to a shelf manager. For example, communication link 550 serves as a management bus and may be routed over backplane 140 to couple modules received in front slots 102A-N to shelf manager 515 as shown in FIG. 5. As a result, communication link 550 may be an example of an IPMB as described in the ATCA specification and mentioned above.

In one example, an ATCA compliant chassis 101 uses a process described in the ATCA specification as electronic keying or "E-keying" for shelf manager 515 to obtain configuration parameters from modules received in front slots 102A-N. As part of an ATCA E-keying process, ATCA compliant modules present configuration parameters to a shelf manager upon insertion in a slot or when a chassis is powered up. These configuration parameters, for example, may include information regarding the types of communication channels associated with a communication interface on a module and a number of ports in module connectors to route at least a portion of a communication channel to a backplane. The information may also include a module's preference for a given type of communication protocols to forward data on a communication channel.

In one example, information from a module is used for an ATCA E-keying process and is included in a table stored on a storage medium accessible to the module (e.g., memory 430). The table may be made accessible or transmitted by the module to a shelf manager or to other modules coupled in slots in an ATCA compliant chassis. Making accessible or transmitting the table may be referred to as "presenting" the information and receiving or accessing the information may be referred to as "obtaining" the information.

In one implementation, shelf manager 515 of chassis 101 may obtain the information from module 130 when module 130 is either powered up or received in front slot 102L. In this example, shelf manager 515 may obtain the information including the configuration parameters for module 130. Shelf manager 515 may then compare that configuration parameter information to configuration parameter information for other modules received in a slot of chassis 101 (e.g., module 110 and/or module 120) to determine commonalities/compatibilities between the modules. Shelf manager 515, in one example, may then determine the capabilities of a slot in chassis 101 to route at least one communication channel from ports in a module's connectors to one or more chassis 101 backplanes and to another module received in another slot in chassis 101. Based on that determination, for example, shelf manager 515 may enable or notify module 130 that a given number of ports in one or more module connectors can be enabled to forward data. The data to be forwarded, for example, from a communication interface on module 130.

In one implementation, as described more below, an ATCA compliant chassis 101 may follow a standard E-keying process described in the ATCA specification to enable communication channels routed through ports in module connectors coupled to backplane 140. However, communication channels routed to ports in module connectors coupled to backplane 150, as mentioned above, may be related to enhanced modules and provide additional communication channels and/or ports that a standard shelf manager may not recognize when implementing the standard E-keying process. As described below for FIG. 6, these additional communication channels and/or ports may be enabled in an example method. The example method can be implemented in various ways and is not limited to only the ways described below for FIG. 6.

Figure 6:
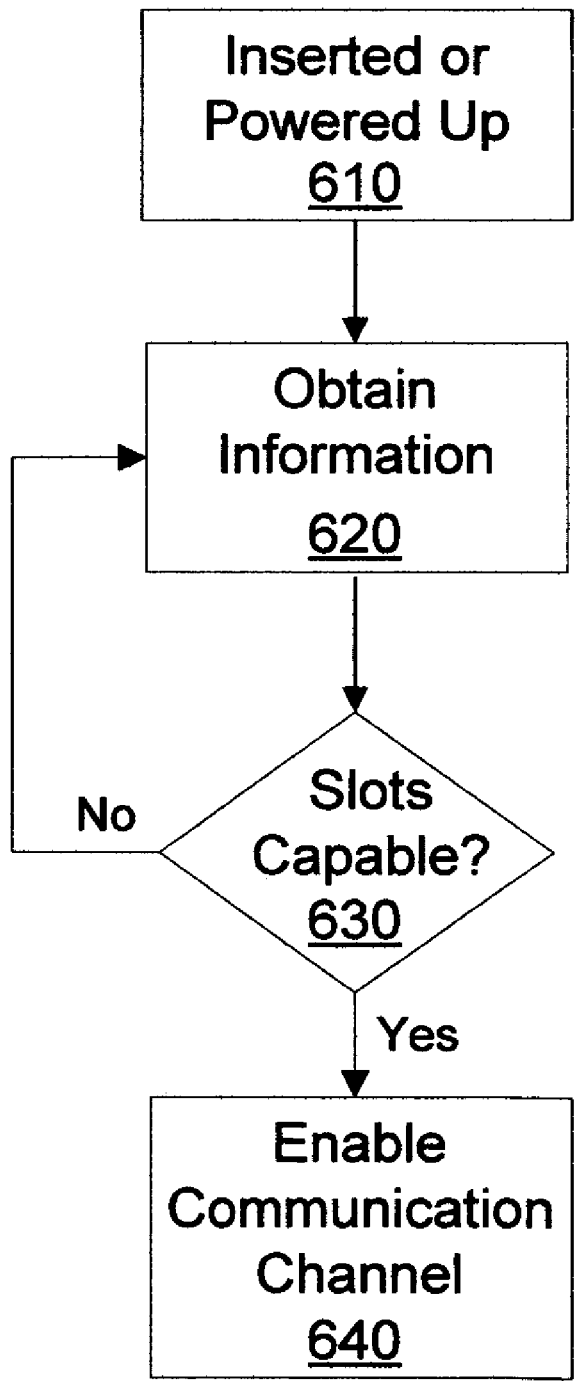
FIG. 6 is a flow chart of an example method to enable ports in a connector for a module.

FIG. 6 is a flow chart of an example method to enable ports in a connector for module 130. In the example method of FIG. 6, module 130 may be received in a slot of front slots 102A-N in chassis 101. For this example method, architecture 500 for modular platform system 100 as depicted in FIG. 5 is used.

In block 610, in one example, module 130 is inserted or powered up in front slot 102L. In one ATCA example, this insertion or power up results in an event described in the ATCA specification as a Hot Swap event (e.g., "FRU Activation in Progress" (M3)). This Hot Swap event, for example, may indicate to shelf manager 515 that a module has been received and/or powered up in chassis 101.

In block 620, in one example, communication channel logic 410 of module 130 activates information feature 412. Information feature 412, for example, may access configuration parameters (e.g., from memory 430). These configuration parameters may include information regarding the types of communication channels associated with a communication interface on module 130 and a number of ports in one or more module 130 connectors which route a communication channel associated with the communication interface. For example module 130 may route an electrical-based communication channel to a port in connector 132 and an optical-based communication channel to another port in connector 134. The type information may also include module 130's preference for a given communication protocol (e.g., PICMG 3.x, TFI-5) for each communication channel. Information feature 412, in one implementation, provides this information to shelf manager 515. In another implementation, information feature 412 provides this information to shelf manager 515 and/or directly to another module coupled to backplanes 140 and/or 150.

In one example, shelf manager 515 may follow the standard E-keying process described in the ATCA specification to enable a given number of ports in connector 132 to forward data from a communication interface on module 130 through at least one communication channel. The data forwarded to, for example, another module received in another slot in chassis 101. For example, at least one communication channel is routed to a switch module received in front slot 102H. Module 130 and the switch module may also be ATCA compliant and may provide their configuration parameters (e.g., over communication link 550) to shelf manager 515. The configuration parameters, for example, are related to the communication channel to be routed to ports in each module's connector coupled to backplane 140.

In one implementation, backplane 150 provides an additional communication channel associated with a communication interface on module 130 when module 130 is received in front slot 102L and coupled to backplane 150 via connector 134. In this example, the ATCA specification does not describe a standard E-keying process to enable this additional channel. As a result, superset or enhanced features, for example, are utilized by elements of chassis 101 to enable this additional channel. These superset features may include module 130 communicating enhanced features to shelf manager 515 using one or more original equipment manufacturer (OEM) E-keys. The superset features may also include module 130 communicating directly to a switch module. Thus, without the use of shelf manager 515, module 130 may enable port 134A in connector 134 to forward data via the additional communication channel. The superset features may also include communications that have a combination of direct and shelf manager 550 involvement.

In this implementation, whether using shelf manager 515, direct module communication, or a combination of shelf manager 515 and direct module communication, module 130 and the switch module provide their configuration parameters (e.g., over communication link 550 or other communication link) related to the communication channel routed to port(s) in each module's connector coupled to backplane 150.

In block 630, in one example, shelf manager 515 may assess the capabilities of front slot 102L and 102H to route the communication channel from a port in a module's connector to backplane 140. In an ATCA compliant chassis 101, for example, front slot 102A-N has the capability to route at least one communication channel from ports 132A-E in connector 132 to backplane 140 and to a switch module in front slot 102G or 102H. As mentioned above, the ATCA specification requires at least this slot capability when a dual-star fabric topology is implemented. Thus, as depicted in FIG. 3, when module 130 is received in front slot 102L, front slot 102L has the capability to route communication channel 147L from ports 132A-E in connector 132 to backplane 140 and then to front slot 102H. In this example, shelf manager 515 may indicate to module 130 that both slots are capable of routing the communication channel to backplane 140. If the slots lack the capability, in one example, the process returns to block 620 to obtain more information and possibly make another determination based on the additional information.

In one example, shelf manager 515 may also assess the capabilities of front slot 102L and 102H to route the communication channel from port 134A in connector 134 to backplane 150. Also as depicted in FIG. 3, when module 130 is received in front slot 102L, communication channel 157L is routed to a switch module received in front slot 102H. In one example, chassis 101 may maintain an OEM MultiRecord Area (MRA) as described in the ATCA specification (e.g., in FRU 525). This OEM MRA may include information to indicate the types of topologies that slots routing communication channels to backplane 150 may support. For example, the OEM MRA may include information to indicate the fabric architecture 300 depicted in FIG. 3. Thus, the OEM MRA may indicate that both front slot 102L and 102H are capable of routing a communication channel to backplane 150. As mentioned above, shelf manager 515 may indicate to module 130 the capability of both slots to route the communication channel to backplane 150. If the capability is lacking in either slot, the process returns to block 620.

In one implementation, a module may determine on its own whether a slot has the capability to route the communication channel from a port in a connector to backplane 150 and to another module. For example, communication channel logic 410 of module 130 activates enable feature 414 to access an OEM MRA for chassis 101. Enable feature 414, for example, uses the OEM MRA to determine whether front slot 102L has the capability to route communication channel 157L from connector 134 to backplane 150 and to a switch module received in front slot 102H. If the OEM MRA does not indicate this capability, the process returns to block 620 to possibly obtain more information and make another determination.

In another implementation, enable feature 414 may determine each slot's capability by trying to communicate with the switch module in slot 102H over the communication channel routed to backplane 150. If module 130 is unable to communicate with the switch module via the communication channel, then, by inference, enable feature 414 determines that front slot 102L and/or 102H does not have the capability to route the communication channel from port 134A in connector 134 to backplane 150. In this case, the process may return to block 620 to possibly obtain more information and make another determination.

In block 640, in one example, shelf manager 515 indicates to module 130 that front slots 102L and 102H have the capability to route the communication channels (e.g., 147L and 157L) from connectors 132 and 134 to backplanes 140 and 150, respectively. In this example, communication channel logic 410 of module 130 activates enable feature 414 to enable ports included in connectors 132 and 134 to forward data from a communication interface on module 130 and through the communication channels to the switch module in front slot 102H.

In an example where shelf manager 515 is not used to determine the capability of the slots, enable feature 414 may enable the ports based on the OEM MRA information and/or on module 130's attempt to establish communications with another module via the one or both communication channels.

In one example, chassis 101 includes a single backplane but the slots to route communication channels to this backplane include enhanced capabilities to route one or more communication channels from ports in a module's connector to this backplane. In this example, modules 130 and the switch module in front slot 102H also include connectors with additional ports via which additional communication channels can be routed to the single backplane. The same process described above may be used but instead of a determination being made for each backplane, a determination is made first of the standard capabilities (e.g., required for ATCA compliance) and then a determination is made as to the enhanced capabilities (e.g., superset to ATCA compliance). Enable feature 414, for example, will enable a given number of ports in the module connectors to forward data from a communication interface on module 130 to the switch module though at least one communication channel to the switch module based on these determinations.

The process then starts over for another module when the other module is inserted and/or chassis 101 goes through a power cycle that powers down and then powers up modules received in slots in chassis 101.

Referring again to memory 430 in FIG. 4. Memory 430 may include a wide variety of memory media including but not limited to volatile memory, non-volatile memory, flash, programmable variables or states, random access memory (RAM), read-only memory (ROM), flash, or other static or dynamic storage media.

In one example, machine-readable instructions can be provided to memory 430 from a form of machine-accessible medium. A machine-accessible medium may represent any mechanism that provides (i.e., stores) information or content in a form readable by a machine (e.g., an ASIC, special function controller or processor, FPGA, module or other hardware device). For example, a machine-accessible medium may include: ROM; RAM; magnetic disk storage media; optical storage media; flash memory devices; and the like.

In the previous descriptions, for the purpose of explanation, numerous specific details were set forth in order to provide an understanding of this disclosure. It will be apparent that the disclosure can be practiced without these specific details. In other instances, structures and devices were shown in block diagram form in order to avoid obscuring the disclosure.

References made in this disclosure to the term "responsive to" are not limited to responsiveness to only a particular feature and/or structure. A feature may also be "responsive to" another feature and/or structure and also be located within that feature and/or structure. Additionally, the term "responsive to" may also be synonymous with other terms such as "communicatively coupled to" or "operatively coupled to," although the term is not limited in his regard.

What is claimed is:

1. A method comprising:
   receiving a module in a slot in a chassis, the module coupling to one or more backplanes via one or more module connectors on the module;
   obtaining information from the module indicating ports in the one or more module connectors through which the slot may route at least one communication channel associated with a communication interface on the module;
   determining the indicated ports over which the slot may route the at least one communication channel to the one or more backplanes in the chassis and to another module received in another slot in the chassis; and
   enabling a given number of the indicated ports to forward data from the communication interface on the module and through the at least one communication channel to the other module based, at least in part, on the determination.

2. A method according to claim 1, wherein obtaining information from the module comprises the module providing the information to a hardware manager for the chassis, the hardware manager determining the indicated ports over which the slot may route the at least one communication channel to the backplane and to the other module received in the other slot; and further comprising:
   the hardware manager communicating the indicated ports to the module, the module enabling the given number of the indicated ports based, at least in part, on the determination.

3. A method according to claim 2, further comprising the chassis operating in compliance with the Advanced Telecommunication Computing Architecture specification, the one or more backplanes including a first and a second backplane, the module including a first module connector having ports to route at least a portion of the at least one communication channel to the first backplane, and a second module connector having ports to route at least another portion of the at least one communication channel to the second backplane.

4. A method according to claim 3, wherein the module providing the information to the hardware manager comprises the module providing the information via a standard electronic keying (E-keying) process that enables the given number of indicated ports to route the at least one communication channel to the first backplane.

5. A method according to claim 4, wherein the module providing the information to the hardware manager comprises the module providing the information via an Original Equipment Manufacturer (OEM) E-keying process for enabling a given number of second connector ports to route the at least one communication channel to the second backplane, the hardware manager using an OEM MultiRecord Area (MRA) for determining the indicated ports over which the slot may route the at least one communication channel to the second backplane and to the other module received in the other slot in the chassis.

6. A method according to claim 5, further comprising:
   enabling the given number of second connector ports based on whether data can be forwarded and received through the indicated ports over which it was determined the slot may route the at least one communication channel to the second backplane.

7. A method according to claim 6, wherein the at least one communication channel associated with the communication interface on the module includes an electrical-based communication channel and an optical-based communication channel, the electrical-based communication channel routed to the first backplane and to the other module, the optical-based communication channel routed to the second backplane and to the other module.

8. A method according to claim 1, wherein the one or more backplanes in the chassis comprises a first backplane and a second backplane, the module having a first connector having ports to route a portion of the at least one communication channel to the first backplane and a second connector having ports to route a portion of the at least one communication channel to the second backplane.

9. A method according to claim 8, wherein obtaining information from the module comprises the module providing the information to a hardware manager, the hardware manager determining the indicated ports over which the slot may route the portion of the at least one communication channel from the first connector's ports to the first backplane and to the other module received in the other slot in the chassis.

10. A method according to claim 8, further comprising:
    determining a given number of second connector ports over which the slot may route the portion of the at least one communication channel to the second backplane and to the other module received in the other slot in the chassis, the determination based on whether data can be forwarded and received from the other module through the given number of second connector ports via the portion of the at least one communication channel.

11. A method according to claim 8, wherein the at least one communication channel associated with the communication interface on the module includes an electrical-based communication channel and an optical-based communication channel, the electrical-based communication channel routed to the first backplane and to the other module, the optical-based communication channel routed to the second backplane and to the other module.

12. A method according to claim 1, wherein the at least one communication channel associated with the communication interface on the module comprises the communication interface to include a fabric interface.

13. A module comprising:
a communication interface associated with at least one communication channel;
one or more connectors having ports to route the at least one communication channel to one or more backplanes in a chassis based on the module's insertion in a slot in the chassis; and
a logic to:
determine a number of ports through which the slot may route the at least one communication channel to one or more backplanes in the chassis and to another module received in another slot in the chassis; and
enable a given number of ports on the module to forward data from the communication interface through the at least one communication channel to the other module based, at least in part, on the determination.

14. A module according to claim 13, wherein the one or more connectors includes a first connector designed in compliance with the Advanced Telecommunication Computing Architecture specification and a second connector designed with a superset to the Advanced Telecommunication Computing Architecture specification, the second connector designed superset to include more ports for routing the at least one communication channel to the one or more backplanes in the chassis than is required to be in compliance with the Advanced Telecommunication Computing Architecture specification.

15. A module according to claim 14, the chassis having a hardware manager, the hardware manager to determine whether the slot has the capability to route the at least one communication channel to the one or more chassis backplanes through the ports in the first connector, the hardware manager indicating that capability to the module, the module's logic using that indication for determining a number of ports through which the slot may route the at least one communication channel to the one or more backplanes and to the other module.

16. A module according to claim 14, wherein the at least one communication channel includes an optical-based communication channel and the ports in the second connector includes one or more ports configured such that the ports route the at least one communication channel to the one or more backplanes in an optical manner.

17. A module according to claim 13, wherein the communication interface includes a fabric interface.

18. A system comprising:
a chassis to include one or more backplanes and a plurality of slots to receive modules; and
a module received in a slot of the plurality of slots, the module to include:
a communication interface associated with at least one communication channel;
one or more connectors to include ports to route the at least one communication channel to the one or more backplanes based on receipt in the slot;
a logic to:
determine a number of ports through which the slot may route the at least one communication channel to one or more backplanes in the chassis and to another module received in another slot in the chassis; and
enable a given number of ports on the module to route data from the module through the at least one communication channel to the other module based, at least in part, on the determination.

19. A system according to claim 18, further comprising the chassis to operate in compliance with the Advanced Telecommunication Computing Architecture specification and the one or more backplanes to include a first and a second backplane, the module having a first connector having ports through which to route at least a portion of the at least one communication channel to the first backplane and a second connector having ports through which to route at least another portion of the at least one communication channel to the second backplane.

20. A system according to claim 19, wherein the at least one communication channel associated with the communication interface on the module includes an electrical-based communication channel and an optical-based communication channel, the electrical-based communication channel routed to the first backplane and to the other module, the optical-based communication channel routed to the second backplane and to the other module.

21. A machine-accessible medium comprising content, which, when executed by a machine causes the machine to:
obtain information from a module received in a slot in a chassis, the information indicating a number of ports in one or more module connectors through which the slot may route at least one communication channel associated with a communication interface on the module;
determine the indicated ports through which the slot may route the at least one communication channel to one or more backplanes in the chassis and to another module received in another slot in the chassis; and
enable a given number of the indicated ports to forward data from the communication interface on the module and through the at least one communication channel to the other module based, at least in part, on the determination.

22. A machine-accessible medium according to claim 21, further comprising the chassis to operate in compliance with the Advanced Telecommunication Computing Architecture specification and the one or more backplanes to include a first and a second backplane, the module having a first connector having ports to route the at least one communication channel to the first backplane and a second connector having ports to route the at least one communication channel to the second backplane.

23. A machine-accessible medium according to claim 22, wherein the at least one communication channel associated with the communication interface on the module includes an electrical-based communication channel and an optical-based communication channel, the electrical-based communication channel routed to the first backplane and to the other module, the optical-based communication channel routed to the second backplane and to the other module.

* * * * *